United States Patent
Pogrebnyak (10) Patent No.: US 10,862,269 B2
(45) Date of Patent: Dec. 8, 2020

(54) BLOCH MIRROR RESONATOR AND DISTRIBUTED FEEDBACK LASER USING SAME

(71) Applicant: The Research Foundation for The State University of New York, Amherst, NY (US)

(72) Inventor: Victor Pogrebnyak, Amherst, NY (US)

(73) Assignee: The Research Foundation for The State University of New York, Amherst, NY (US)

( * ) Notice: Subject to any disclaimer, the term of this patent is extended or adjusted under 35 U.S.C. 154(b) by 0 days.

(21) Appl. No.: 16/484,513

(22) PCT Filed: Feb. 8, 2018

(86) PCT No.: PCT/US2018/017375
§ 371 (c)(1),
(2) Date: Aug. 8, 2019

(87) PCT Pub. No.: WO2018/148375
PCT Pub. Date: Aug. 16, 2018

(65) Prior Publication Data
US 2020/0006919 A1 Jan. 2, 2020

Related U.S. Application Data

(60) Provisional application No. 62/456,183, filed on Feb. 8, 2017.

(51) Int. Cl.
*H01S 5/00* (2006.01)
*H01S 5/10* (2006.01)
(Continued)

(52) U.S. Cl.
CPC ............ *H01S 5/1096* (2013.01); *H01S 5/101* (2013.01); *H01S 5/1003* (2013.01); *H01S 5/105* (2013.01);
(Continued)

(58) Field of Classification Search
CPC ........ H01S 5/1234; H01S 5/101; H01S 5/105; H01S 5/1092; H01S 5/3432; H01S 5/12; H01S 5/1243; H01S 5/1096; H01S 5/1003
See application file for complete search history.

(56) References Cited

U.S. PATENT DOCUMENTS 5,420,947 A * 5/1995 Li ............................ G02B 6/34
359/569
5,970,081 A * 10/1999 Hirayama ............... H01S 5/187
372/102

(Continued)

FOREIGN PATENT DOCUMENTS

WO 2016/076793 A1 5/2016

OTHER PUBLICATIONS

Hermannsson, P.G., et al., Design and use of guided mode resonance filters for refractive index sensing, Technical University of Denmark, Jul. 2015, Ph.D. Thesis, 141 pages. http://orbit.dtu.dk/files/116664818/ThesisWithPreprints.pdf.

(Continued)

*Primary Examiner* — Kinam Park
(74) *Attorney, Agent, or Firm* — Hodgson Russ LLP (57) ABSTRACT

A resonator is provided having a waveguide with a first boundary, a second boundary parallel to the first boundary, a first end, a second end, and a waveguide cavity at least partly between the first boundary and the second boundary. A first grating, having a period of distance a, is at the first boundary of the waveguide, and a second grating, having a (Continued)

period of distance a, is at the second boundary of the waveguide. The first and second boundaries are separated by a constant distance d. The first boundary may have a periodic profile aligned with a periodic profile of the second boundary. The periodic profile of the first boundary and the second boundary may be a sinusoidal profile, a square profile, or profile of another shape. The resonator may be suitable for use in a distributed feedback laser.

16 Claims, 5 Drawing Sheets

(51) Int. Cl.
    *H01S 5/12*   (2006.01)
    *H01S 5/343*  (2006.01)
(52) U.S. Cl.
    CPC .............. *H01S 5/1092* (2013.01); *H01S 5/12* (2013.01); *H01S 5/1234* (2013.01); *H01S 5/1243* (2013.01); *H01S 5/3432* (2013.01)

(56) References Cited

U.S. PATENT DOCUMENTS

| | | |
|---|---|---|
| 6,597,721 B1 | 7/2003 | Hutchinson et al. |
| 6,614,960 B2 | 9/2003 | Berini |
| 6,680,799 B1 | 1/2004 | Parriaux et al. |
| 6,885,804 B2 | 4/2005 | Park et al. |
| 6,888,874 B2 | 5/2005 | Masood et al. |
| 6,934,313 B1 | 8/2005 | Deacon |
| 7,627,018 B1 | 12/2009 | Guilfoyle et al. |
| 7,835,418 B2 * | 11/2010 | Hatori ...................... H01S 5/12 372/96 |
| 3,238,702 A1 | 8/2012 | Flammer |
| 8,270,789 B2 | 9/2012 | Ogawa et al. |
| 8,270,790 B2 | 9/2012 | Ogawa et al. |
| 8,472,493 B2 | 6/2013 | Dupont et al. |
| 3,536,603 A1 | 9/2013 | Illek et al. |
| 9,435,961 B2 | 9/2016 | Jiang |
| 9,472,922 B2 | 10/2016 | Bachmann et al. |
| 9,762,029 B2 | 9/2017 | Gotoda et al. |
| 2012/0072931 A1 * | 3/2012 | Imada ................. G11B 7/1384 720/672 |
| 2015/0063753 A1 | 3/2015 | Evans et al. |
| 2016/0380407 A1 * | 12/2016 | Sysak ................... G02B 6/124 398/214 |
| 2017/0317471 A1 * | 11/2017 | Lor ........................ G02B 6/124 |

OTHER PUBLICATIONS

Huang, Y., et al., Nanoscale Plasmonic Devices Based on Metal-Dielectric-Metal Stub Resonators, International Journal of Optics, 2012, vol. 2012, 13 pages. https://www.hindawi.com/journals/ijo/2012/372048/.

McCutcheon, M.W. and Loncar, M, Design of an ultrahigh Quality factor silicon nitride photonic crystal nanocavity for coupling to diamond nanocrystals, Optics Express, 2008, vol. 16, No. 23, pp. 19136-19145. https://arxiv.org/pdf/0809.5066.pdf and https://www.osapublishing.org/oe/fulltext.cfm?uri=oe-16-23-19136&id=174217.

Xu, G., et al., Efficient power extraction in surfaceemitting semiconductor lasers using graded photonic heterostructures, Nature Communications, Jul. 17, 2012, vol. 3, No. 952, pp. 1-7. https://www.nature.com/articles/ncomms1958.pdf.

* cited by examiner

BLOCH MIRROR RESONATOR AND DISTRIBUTED FEEDBACK LASER USING SAME

CROSS-REFERENCE TO RELATED APPLICATIONS

This application claims priority to U.S. Provisional Application No. 62/456,183, filed on Feb. 8, 2017, the disclosure of which is incorporated herein by reference.

FIELD OF THE DISCLOSURE

This disclosure relates to a resonator configuration for distributed feedback laser applications.

BACKGROUND OF THE DISCLOSURE

Interest in band-gap engineering has intensified in recent years due in part to advances in nanofabrication that enable nanostructured materials with unprecedented electromagnetic, electronic, and photonic properties. Such materials hold promise for transformative impact in fields such as integrated optics, photonic crystals, metamaterials, plasmonics, electronics, and more generally topological electronics and photonics. Many such applications exploit Bragg band gaps that are well known to exist in structures with periodic material properties.

Figure 1:
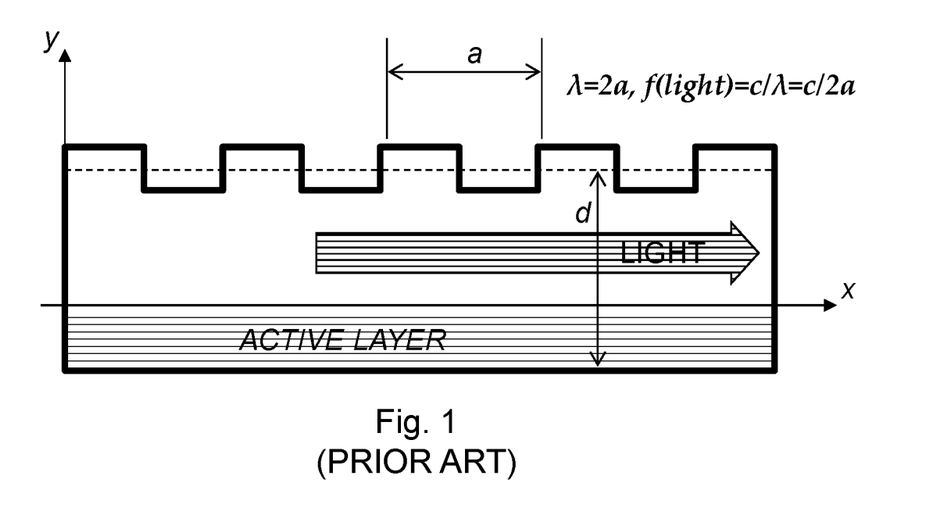
FIG. 1 is a diagram of a prior art Bragg mirror with a grating period a and an average thickness d.

The heart of a distributed feedback ("DFB") laser is a corrugated light-guiding layer usually referred to as a "grating" or "distributed feedback mirror." The imposed grating periodicity blocks propagation of light with a specific wavelength ($\lambda$) equal to twice the period (a) of the grating. The relation is known as Bragg's law, and the corresponding mirror is known as a Bragg mirror (FIG. 1). The blocked non-propagating wave (evanescent wave) can be amplified by pumping light from an adjacent active layer due to an applied voltage and current. The amplitude of the evanescent wave increases as is spreads towards the edges of the layer. At the edge of the Bragg mirror, the amplified evanescent wave escapes the grating and becomes propagating light.

For amplification, a wave should be blocked inside the mirror. The wavelength of the blocked wave is determined by a period of the grating. Accordingly, by its nature, a DFB laser or similar with Bragg mirrors can emit light with a specific wavelength given by $\lambda=2a$. Therefore, widely used DFB semiconductor lasers or any others with a Bragg mirror are known as single frequency, single wavelength, or, more generally, single mode lasers. These lasers can emit red, blue, or green light, or other colors, for example, 1550 nm wavelength light used for transmissions through fiber optic communication cable.

To date engineers and researchers have not been able to design a cavity capable of simultaneously confining light of different colors or, in other words, confining a rainbow in a cavity. The availability of such cavity would open doors for designing a white color mirror and white laser that amplifies a rainbow in one cavity. Semiconductor white-light sources are in great demand because of their potential large economic benefits. Accordingly, there is a critical, long-felt need for a white light laser.

BRIEF SUMMARY OF THE DISCLOSURE

In an embodiment of the present disclosure, a conventional DFB grating (Bragg mirror) is replaced with specifically-designed dielectric slab (hereinafter called a "Bloch mirror"). This Bloch mirror dielectric slab resonator expands the operating wavelength of a conventional laser Bragg mirror resonator from a single wavelength to a multicolor wavelength range. The disclosed periodic structure of the Bloch mirror slab confines and amplifies light propagation in a wide range of wavelengths simultaneously. This allows for amplification of multiple components (i.e., "rainbow components") of white light. The Bloch mirror may be made of a high-refractive-index material like, for example, GaN (n=2.5) with periodic first and second boundaries, which are aligned (in phase) in contrast to widely used configurations where periodic profiles are out of alignment having relative phase shift of 180 degrees. The slab may be transparent for light. An amplitude of thickness modulation $\xi$ varies between 10% and 30% of the average thickness of a layer d, and wherein $$d = \frac{a}{2}\sqrt{p^2 - m^2}$$

(p and m are indices of waveguide modes and p>m; p=1, 2, 3, . . . ; m=1, 2, 3, . . . ). For example, in a particular embodiment where the waveguide modes are p=2 and m=1, then $d=a\sqrt{3}/2$ and d is constant over the length of the mirror (the x-axis in FIG. 2a).

White light lasers could have broad application in fields such as:

Visible Light Communication (VLC): A new high-speed communications technology, known also as Li-Fi, using visible light instead of microwaves (such as in Wi-Fi) for transmitting data. The human eye does not perceive high rate light amplitude or phase variations carrying information. Therefore, the lighting in a room or on a street looks as ordinary lighting not transmitting data. So far, LEDs have been used for VLC/Li-Fi, and transmission speeds have reached 224 Gbit/s. A white DFB laser has the potential to increase the speed tenfold.

Optical Communications: A DFB laser is the heart of a photonic integrated circuit (PIC). PICs are replacing electronic integrated circuits (IC) when the volume of data and speed of their processing exceed the capability of ICs. Usage of a multi-mode (wavelengths) DFB laser with a Bloch mirror would significantly expand the capacity and speed of PICs and would make them suitable for fast optical processing of big data, Internet-of-Things, and quantum computing applications.

Automotive: Laser light is an absolute innovation in automotive lighting and the next big step forward since the introduction of headlight technologies using halogen, xenon, and LEDs. This lighting trend opens up completely new horizons in the design and performance of headlights. Several companies are testing white laser diode technologies for headlights. For example, BMW and Audi demonstrated that laser diode headlights shine 650 yards ahead of the car providing an advantage in safety. These headlights use laser diodes to energize a phosphor that creates the white light. A white DFB laser utilizing the technology disclosed herein would allow the direct creation of white light without any additional conversion.

Indoor Lighting for Horticulture: Indoor horticulture offers a sustainable food production and is a fast-growing industry. However, a lack of efficient and cheap sources of white light with desirable color rendering index (CRI) has slowed further development. Currently available LED lamps do not properly stimulate growth. High efficiency white light lasers may make a great difference in boosting this emerging agricultural industry.

Lighting: The quality of white light sources is characterized by the CRI. Natural visible light has a CRI of 100%, while cool or warm LED light may have CRIs of 70%-80%. To reach 100% CRI, a white light source should include more light components than current LED or laser diodes (LD). The presently-disclosed Bloch mirror can provide higher CRIs—closer to 100%.

In an aspect, a resonator is provided. The resonator includes a waveguide having a first boundary, a second boundary parallel to the first boundary, a first end, a second end, and a waveguide cavity at least partly between the first boundary and the second boundary. The waveguide may be an optical waveguide. The waveguide may comprise a dielectric material. For example, the waveguide may comprise gallium nitride (GaN).

A first grating is at the first boundary of the waveguide. The first grating has a period of distance a. A second grating is at the second boundary of the waveguide. The second grating has a period of distance a. The first boundary may have a periodic profile aligned with a periodic profile of the second boundary. The periodic profile of the first boundary and the second boundary may be a sinusoidal profile, a square profile, or profile of another shape. The thickness of the periodic profile of the first boundary and the second boundary (i.e., a profile of the first grating and the second grating) may be between 10% and 30% (inclusive) of the distance d. A first phase of the first grating may be substantially aligned with a second phase of the second grating. The first grating and/or the second grating may be formed using one or more transducers, such as, for example, acousto-optic, electro-optic, or piezoelectric transducers. The first grating and the second grating may be acoustic waves.

A distance d between the first boundary and the second boundary is constant. Distance d may be equal to $$\frac{a}{2}\sqrt{p^2 - m^2},$$

where p and m are mode indices in the waveguide and p>m. For example, in an embodiment where the waveguide mode indices are p=2 and m=1, the distance d between the first boundary and the second boundary is equal to $a\sqrt{3}/2$. The resonator comprises an active layer for light generation.

The present disclosure may be embodied as a distributed feedback laser comprising a resonator of an embodiment disclosed herein.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

In one aspect of the present disclosure, a resonator for a distributed feedback (DFB) is provided which is suitable to replace a conventional DFB laser grating (mirror).

Figure 2A:
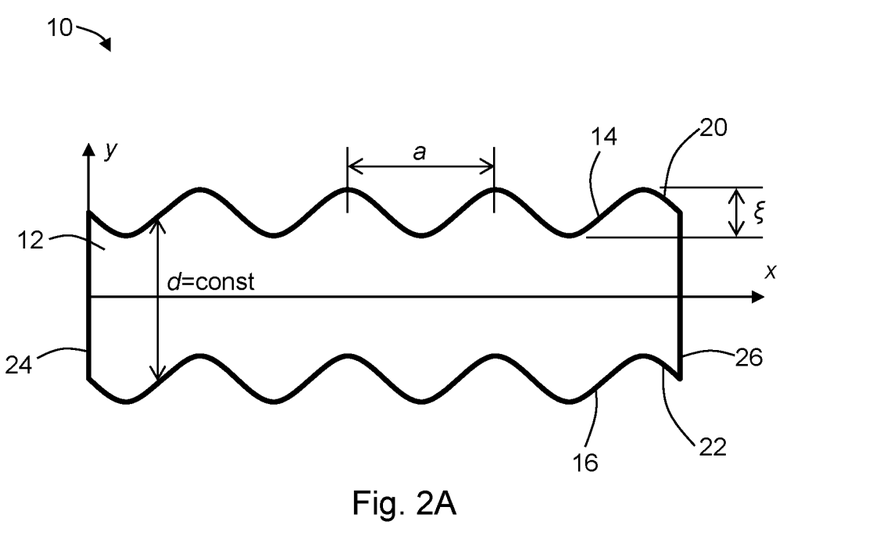
FIG. 2A is a diagram of a sinusoidal boundary Bloch mirror resonator of the present disclosure with a grating period a and a constant thickness d, wherein the sinusoidal shapes of upper and lower boundaries are aligned (in phase) along the x-axis.
Figure 2B:
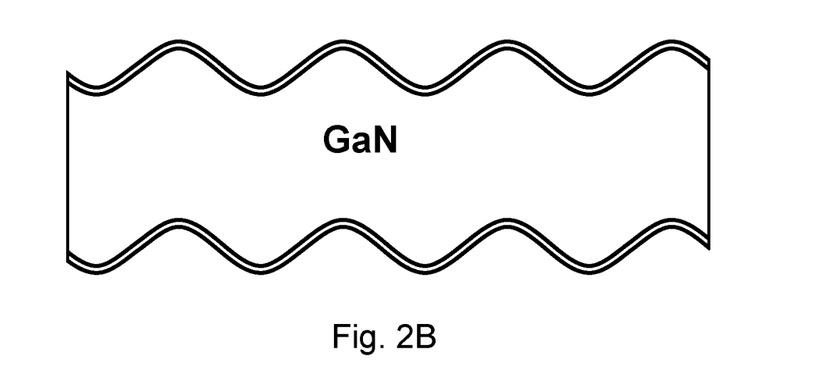
FIG. 2B is a diagram of the sinusoidal boundary Bloch mirror resonator from FIG. 2A where the resonator is gallium nitride.

With reference to FIG. 2A, the present disclosure may be embodied as a resonator 10 having a waveguide 12 with a first boundary 14 and a second boundary 16. The second boundary 16 is parallel to the first boundary 14 and their periodic profiles are aligned along the x-axis. The resonator 10 has a first end 24 and a second end 26. A first grating 20 is at the first boundary 14 of the waveguide 12. The first grating 20 has a period of distance a. A second grating 22 is at the second boundary 16 of the waveguide 12. The second grating 22 has a period of distance a. The first boundary 14 and second boundary 16 are separated by a distance d that is constant along the x-axis. The distance d may be equal to $$\frac{a}{2}\sqrt{p^2 - m^2},$$

where p and m are indices of the waveguide mode and p>m (further described below under the heading "Further Discussion"). In a particular example, where p=2 and m=1, then d=a√3/2.

Figure 3:
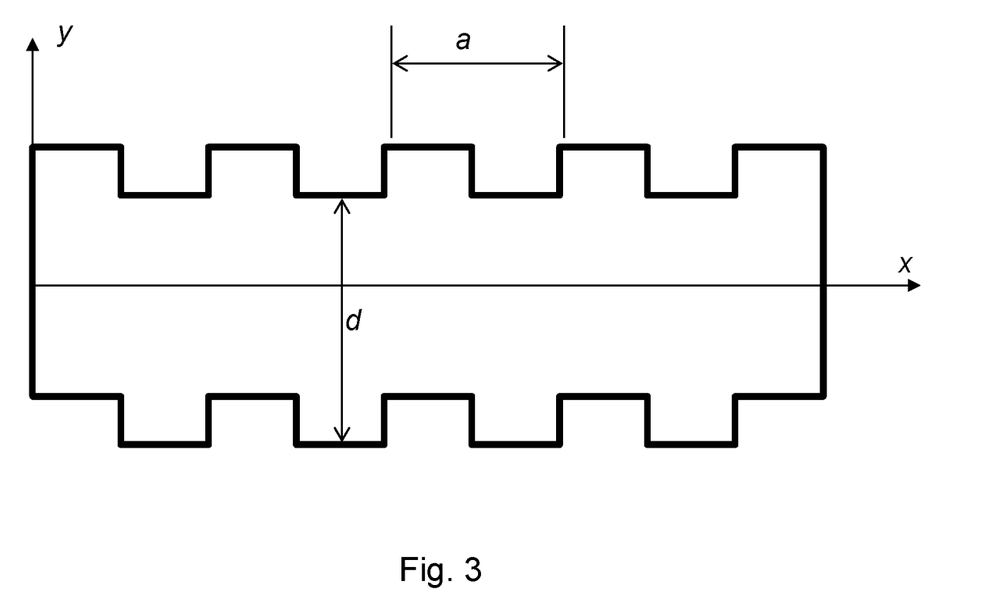
FIG. 3 is a diagram of a rectangular boundary Bloch mirror resonator according to another embodiment of the present disclosure, with a grating period a and a thickness d, wherein the rectangular shapes of upper and lower boundaries are aligned (in phase) along the x-axis providing constant thickness d.
Figure 4:
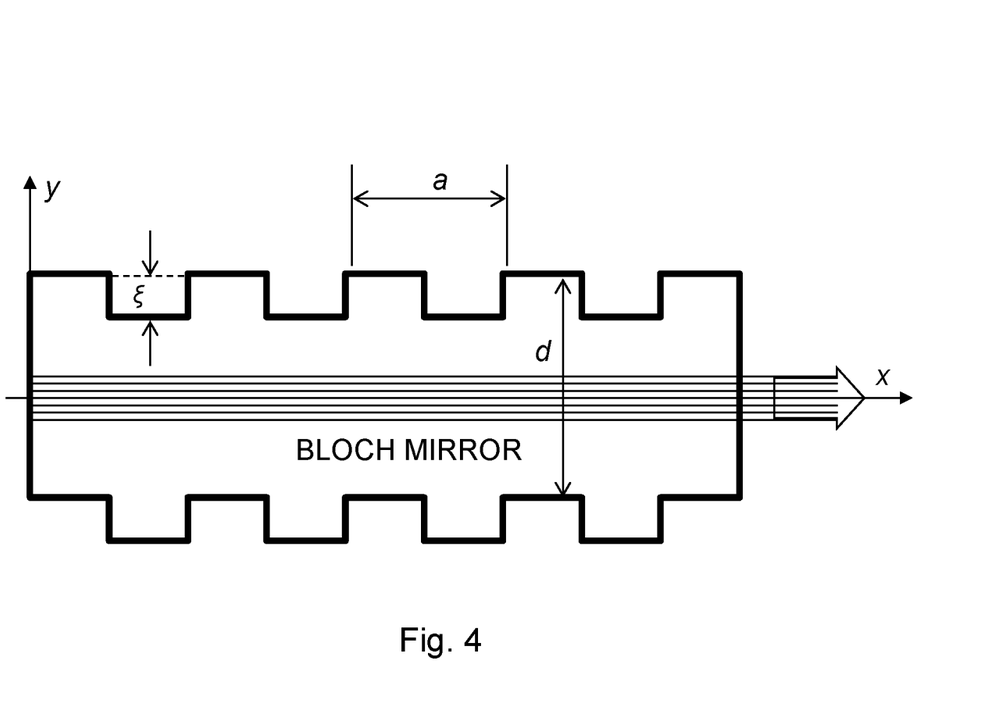
FIG. 4 is a diagram of a rectangular boundary Bloch mirror resonator of another embodiment of the present disclosure with a grating period a, a constant thickness d, and a thickness modulation of ξ, further depicting multicolored (white) light traveling along the x-axis.

Each of the first grating and the second grating may have a profile which has periodic modulation (a "periodic profile"). The profile may be sinusoidal, square, or other profiles (see, for example, FIGS. 2A and 3). The amplitude of the modulation (i.e., the thickness of the boundary profile), which may be expressed as $\xi$, is between 10% and 30% (inclusive) of the distance d. In particular embodiments, $\xi$ may be 10%, 15%, 20%, 25%, or 30% of d. It will be recognized that the distance between the first boundary 14 and the second boundary 16 may vary according to the profiles of the gratings at each boundary. For example, FIG. 2A shows that where the first boundary 14 is aligned with the second boundary 16, the distance d is constant. However, where the boundaries are not aligned, the distance d may differ at various positions along the x-axis. As such, the distance d between the first and second boundaries 14,16 may be expressed herein as the distance from an average point of the first grating to an average point of the second grating.

In a particular embodiment, where the resonator is suitable for use in a distributed feedback laser, the waveguide is an optical waveguide. The optical waveguide may be made from a high-refractive-index material, such as, for example, GaN (n=2.5). Using the axis orientation of the figures for convenience (but not intended to be limiting), the waveguide may be transparent to light along the x-axis.

The relationship between the thickness d and period a of the mirror may be given by the following formula:

$$d = \frac{a}{2}\sqrt{p^2 - m^2} \quad (1a)$$

$$d = p\frac{\lambda_0}{2n} = m\frac{\lambda_1}{2n}, (p > m) \quad (1b)$$

Where d and a are the thickness and period of the layer, p and m are mode indices (i.e., integer numbers 1, 2, 3 . . . ) where p>m, and $\lambda_0$ and $\lambda_1$ are wavelengths of light for different modes, n is the refractive index of a dielectric (e.g., n=2.5 for GaN).

Further Discussion

Considering materials with uniform properties and periodic boundary profiles, Bloch resonance (BR) and band-gap phenomena are described herein. Bloch resonance and band-gap phenomena are distinct from Bragg phenomena. Specifically, Bloch resonances arise from transverse phase matching (TPM), whereas Bragg resonances are due to longitudinal phase matching (LPM). Moreover, Bloch gaps can be engineered over the entire first Brillouin zone up to an infinite wavelength, i.e., $k_x$=0, while Bragg gaps open at a fixed wavelength, twice the period of the structure. Wave phenomena for small $k_x$~0 are especially interesting for novel photonic and electronic applications and a Bloch gap at $k_x$=0 for the electromagnetic (EM) field at GHz frequencies is demonstrated herein. This theory broadly applies to wave phenomena from the quantum to the continuum scale with applications in the fields of solid-state physics, acoustics, photonics, electronics, and lasers, among others.

Figure 5A:
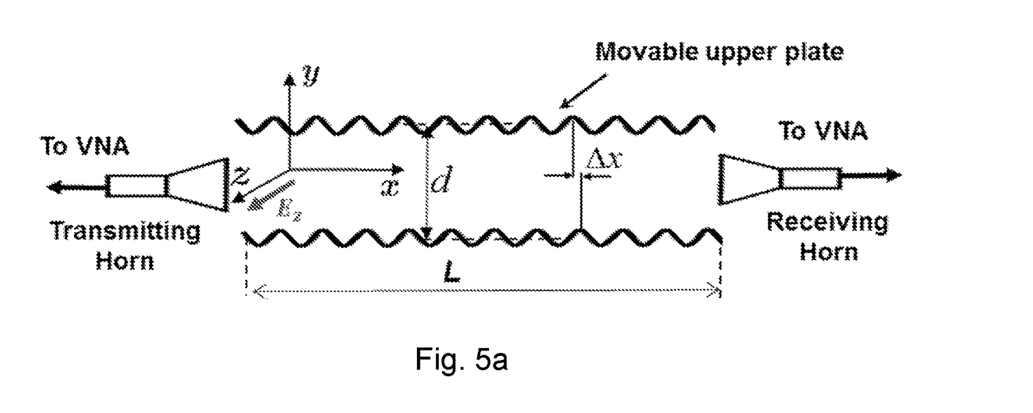
FIG. 5A is a diagram of an experimental set-up for measuring microwave transmission through a sinusoidal boundary Bloch resonator (waveguide) with a length L, thickness d, and lateral plate shift Δx, using a transmitting horn antenna, a receiving horn antenna, and Vector Network Analyzer ("VNA," not shown), showing the x-y cross section of the waveguide (polarization of the $TE_{01}$ WAVE radiated by the horn is along the z-axis)

A theory of Bloch resonances and gaps is developed herein, and the theory was verified experimentally for the EM field at GHz frequencies. For the experiment, a hollow waveguide with reconfigurable metallic boundary plates was used as shown in FIG. 5A. The waveguide had a length L, average height d, and boundary plates with identical sinusoidal profiles along the direction of propagation. The waveguide transmission spectrum can be tuned via a lateral translation of the upper plate, $\Delta x$ along the x-axis, or by a vertical displacement of the plate along the y-axis, which changes d. The behavior of the waveguide was investigated for $TE_{01}$ wave propagation (E along the z-axis).

A traditional method for analyzing wave phenomena in periodic structures is coupled-mode theory, which is well developed and used for applications in integrated optics, solid state electronics, and microwaves. However, most of this work has focused on the coupling of longitudinal waves, for example, longitudinal phase matching ("LPM"). LPM has been expressed as modified Bragg's law, which follows from an analysis of the field represented as a superposition of waveguide modes. However, this prior analysis rarely addresses the transverse wave components, which are emphasized here.

A theory of Bloch resonances and gaps is disclosed herein that takes into account the coupling between traveling and standing waves and provides a complete description of wave propagation. The present analysis is based on the field solution as a superposition of eigenstates that include both longitudinal and transverse wave components. The inclusion of transverse components, which have previously been neglected in more traditional mode expansion approximation, leads to new results—Bloch wave phenomena—and is an advantage of the present disclosure. Specifically, the present analysis shows that a Bloch gap occurs when the cutoff frequencies of two transverse orthogonal eigenmodes coincide. In this case, the two independent states are degenerate, which results in the splitting of the degenerate cutoff frequency into two distinct frequencies that are separated by a forbidden gap in the transmission spectrum—referred to herein as the Bloch gap. Analytical expressions are derived that predict Bloch resonances and gaps when the amplitude of the periodic boundary profile is small. This was validated experimentally and provides a fundamental understanding of wave propagation, including Bragg and Bloch gaps, from a unified point of view.

In the experiment, a sinusoidal profile was defined for the boundaries, i.e., y(x)=$\xi$ cos(qx), where q=2π/a and $\xi$ and a are an amplitude and period of the profile, respectively. In the experiment depicted in FIG. 5A, the top plate can be translated along the x-axis and produce a shift $\Delta x$ between the plates; i.e., the boundary profiles are given by $y_{d/2}(x)$= d/2+$\xi$ cos(qx+θ), and $y_{-d/2}(x)$=−d/2+$\xi$ cos(qx), where θ=(2π/a)$\Delta x$.

The boundary value problem (BVP) for the waveguide reduces to solving Equation (2a), for the z component of the field $E_z(x,y)$ with appropriate boundary conditions (BCs). From the Bloch-Floquet theorem, $E_z(x,y)$ can be represented as the Fourier series in Equation (2b), which is different than a superposition of modes:

$$\Delta E_z + k_0^2 E_z = 0, \quad (2a)$$

$$E_z(x, y) = \sum_{n=0,\pm 1,\ldots} [a_n \cos(k_{y,n} y) + b_n \sin(k_{y,n} y)] \times \exp[j(k_x + nq)x] \quad (2b)$$

where $k_0 = \omega/c$ is the wave vector magnitude and $k_{y,n}$, $k_x$ are transverse and longitudinal components of k, respectively, and the relation between them, $k_{y,n}^2 = k_0^2 - (k_x + nq)^2$, follows from Equations (2a) and (2b).

The solution, Equation (2b), is of the form of a Bloch wave $E_z(x,y) = u_k(x,y) e^{jk_x x}$ where $u_k$ equals the summation in Equation (2b) with $k_x = 0$ in the exponent. In solid state physics, the coefficients $u_k$ (x,y) do not typically include a transverse component $k_y$ because a crystal is usually considered to be large enough in the y direction so that periodic Born-von Kármán BCs apply. However, in the present case, $k_y$ is an advantageous parameter that defines the eigenvalues of the BVP and hence the allowed states. The values of $k_y$ and the dispersion $\omega(k)$ can be determined from Equations (2a) and (2b) by imposing BCs. For the experiment (FIG. 5A), the metallic plates were assumed to be perfect conductors with BCs $$E_z\left[x, y_{\pm \frac{d}{2}}(x)\right] = 0.$$

These BCs were imposed and a system of linear algebraic equations was obtained for the coefficients $a_n$ and $b_n$. If the amplitude of the boundary profile is small, i.e., $\xi/d \ll 1$ and $\xi_q \ll 1$, then, in the first approximation, the equations reduce to six equations for coefficients $a_0$, $a_{\pm 1}$, and $b_0$, $b_{\pm 1}$ that correspond to the n=+1, 0, -1 harmonics. By equating the 6×6 determinant of the reduced system of linear equations set to 0, the following characteristic Equation (3) is obtained for the allowed eigenvalues $k_{y,n}$. There are six corresponding eigenstates, into which the modes of a flat ($\xi=0$) waveguide break upon imposing a periodic boundary:

$$\tan(k_{y,0}d) = \frac{\xi^2}{2} \left\{ \left( \frac{k_{y,0}k_{y,+1}}{\tan(k_{y,+1}d)} + \frac{k_{y,0}k_{y,-1}}{\tan(k_{y,-1}d)} \right) - \frac{\cos\theta}{\cos(k_{y,0}d)} \left( \frac{k_{y,0}k_{y,+1}}{\sin(k_{y,+1}d)} + \frac{k_{y,0}k_{y,-1}}{\sin(k_{y,-1}d)} \right) \right\}. \quad (3)$$

Note the invariance of Equation (3) with respect to the interchange of key parameters $\theta \leftrightarrow -\theta$, $k_{y,+1} \leftrightarrow k_{y,-1}$, and $kx \leftrightarrow -kx$, which reflects an underlying symmetry of the guided wave phenomena.

The solution of Equation (3) can be found by successive approximations using a small parameter $\xi/d$: i.e., $k_{y,0} = k_{y,0}^{(0)} + \delta k_{y,0} + \ldots$, where the $\delta k_{y,0}$, etc., represent successive corrections to the solution. In the lowest $0^{th}$ order approximation (i.e., $\xi=0$, a flat boundary), Equation (3) reduces to $\tan(k_{u,0}d)=0$, resulting in $k_{y,0}^{(0)}(p\pi)/d \equiv k_{y,0,p}$, for p=1, 2, 3, .... Here, $k_{y,0,p}$ and $\omega_{0,p} = c k_{y,0,p}$ denote the $p^{th}$ modes and cutoff frequencies for the n=0 harmonic, respectfully.

Next, the resonance states, which occur when the denominators in Equation (3) vanish, are analyzed:

$$k_{y,\pm 1}d = m\pi \equiv k_{y,\pm 1,m}d, \; m=1,2,\ldots, \quad (4a)$$

where $$k_{y,\pm 1} = \sqrt{k_{y,0,p}^2 \pm 2k_x q - q^2} \quad (4b)$$

Equation (4a), which involves $k_y$, is the condition of resonance, which is referred to herein as TPM. This is in contrast, and in addition, to LPM, which involves matching the $k_x$ component to q only. Equation (4b) follows from the relation $k_{y,\pm 1}^2 = k_0^2 - (k_x + nq)^2$ with $k_0^2 = k_{y,0,p}^2 + k_x^2$ taken in the $0^{th}$ approximation. The behavior of the system becomes clear from an analysis of Eq. (4b), which indicates that there are two types of resonance caused by the $k_x$ and $k_y$ components, respectively.

The first type of resonance is associated with LPM and occurs when $k_x = \pm q/2$, i.e., at the boundaries of the first Brillouin zone (BFBZ), which is the well-known Bragg's law. Substituting $k_{y,\pm 1,m}$ (for $k_{y,\pm 1}$) into Equation (4b), it was found that at the BFBZ, $k_{y,\pm 1,m} = k_{y,-1,m} = k_{y,0,p}$, which implies that m=p for the resonant component. Thus, it was found that Bragg's law is a special case of TPM for m=p. Note that the resonances for $k_{y,\pm 1,m} = k_{y,-1,m}$ are the same because Equation (3) is invariant with respect to the interchange of these parameters ($k_{y,+1,m} \leftrightarrow k_{y,-1,m}$).

Figure 6A:
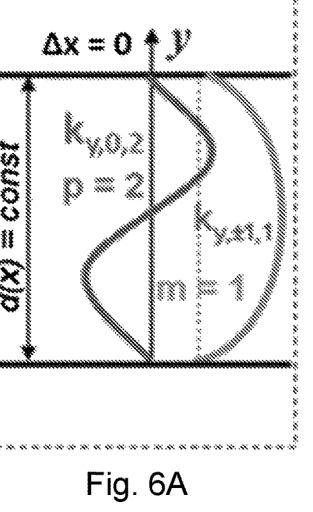
FIG. 6A shows the E field amplitude distribution along the y-axis for degenerate states $k_{y,0,2}$ and $k_{y,\pm1,1}$ with the same frequency at Bloch resonance (Δx=0); 6B dispersion ω(k) for symmetric waveguide (Δx=a/2); and 6C for the asymmetric case at Δx=0, and for $d=a\sqrt{3}/2=2.72$ cm.

The second type of resonance, which is defined herein as the Bloch resonance, occurs when $k_{y,\pm 1,m}d = m\pi$ but $k_x \neq q/2$, i.e., not the Bragg case. As an example, for the m=1 resonances, corresponding spatial harmonics are labelled as $k_{y,\pm 1,1}$. The E field amplitude distribution for these transverse waves along the y-axis is shown in FIG. 6A. Note that the BR can occur at any $k_x$; however, at $k_x=0$, it is a resonance between eigenstates corresponding to cutoff frequencies of the fundamental and first spatial harmonics as described below. The resonance at $k_x=0$ results in a unique band gap structure and is called a geometric BR (GBR) since it only occurs for a unique mix of the geometric parameters when the boundary profiles are aligned, i.e., $\Delta x=0$ and constant d(x).

Figure 6B:
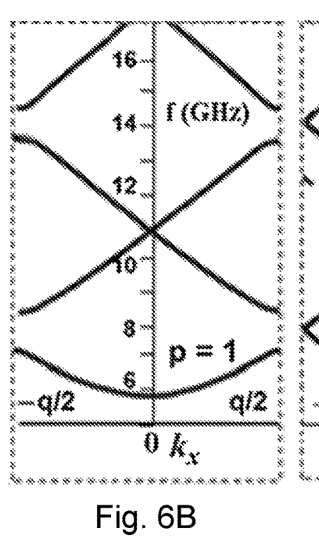
Figure 6C:
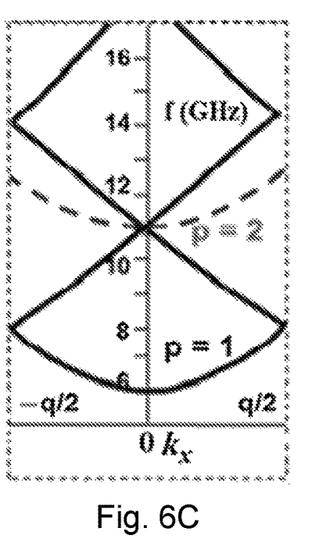

To further elucidate the nature of the GBR, consider FIGS. 6B and 6C, which show the dispersion relation for two waveguide configurations: $\Delta x=a/2$ (symmetric) and $\Delta x=0$ (asymmetric). Only the first mode is shown for the sake of simplicity. In the symmetric waveguide, $d(x)=d+2\xi\cos(qx)$, and the single mode propagation is equivalent to wave propagation in an unbounded medium with a permittivity that varies periodically like d(x). The dispersion for this case reveals typical Bragg gaps at the BFBZ as shown in FIG. 6B.

In the asymmetric case, $\Delta x=0$ and d(x) is constant for all x. Thus, the wave does not undergo Bragg reflection. However, the waveguide possesses translational symmetry and the dispersion can be represented as the folded modes shown in FIG. 6C. This unique property—i.e., the gapless spectrum—is a result of the nature of the periodicity—i.e., the lateral periodicity that keeps the spacing d constant for all x, as in a flat waveguide.

The GBR condition follows from Equations (3a) and (3b) at $k_x=0$ and can be written in terms of wave numbers, geometric parameters, or wavelengths using Equations (5a)-(5c), respectively:

$$k_{y,\pm 1,m}d = d\sqrt{k_{y,0,p}^2 - q^2} = m\pi, \quad (5a)$$

$$d = \frac{a}{2}\sqrt{p^2 - m^2}, \quad (5b)$$

$$d = p\frac{\lambda_0}{2} = m\frac{\lambda_1}{2}, \; (p > m) \quad (5c)$$

where $\lambda_0$ and $\lambda_1$ are wavelengths of the standing waves of the $0^{th}$ and the first spatial harmonics, respectively. From Equation (5b), the GBR between the fundamental $k_{y,0,1}$ and first harmonics $k_{y,\pm1,1}$ (p=2, m=1) occurs at $d=a\sqrt{3}/2$ or $\lambda_{1,1}=2\lambda_{0,2}=2d$. Both waves have uniform amplitudes along the x-axis, i.e., $k_x=0$ ($\lambda_x \to \infty$), but periodic amplitude profiles along the y-axis as shown in FIG. 6A.

The GBR occurs in the asymmetric waveguide if the cutoff frequency of the first harmonics $k_{y,\pm1,1}$ coincides with the cutoff frequency of the $0^{th}$ harmonic of the second mode $k_{y,0,2}$, as shown in FIG. 6C. In this figure the folded dispersion of the first mode (p=1) intersects the cutoff frequency of the second mode (p=2) at $k_x=0$ and f=11.0 GHz, for the above-mentioned unique mix between the geometric parameters given by Equation (4b) with a=3.15 cm. This means that the cutoff frequencies of the two orthogonal eigenstates $k_{y,0,2}$ and $k_{y,\pm1,1}$ coincide [FIGS. 6A-6C], and is therefore degenerate.

The degeneracy is a feature of Bloch resonance and is similar to what occurs in quantum mechanics based on degenerate perturbation theory. More specifically, the degenerate energy level splits into two levels. In the present case, a similar splitting was obtained from the solution of Eq. (3) in the second order of approximation for $k_{y,0}$. In this case, the degenerate frequency level splits into two frequencies $f_{0,2}^+$ and $f_{0,2}^-$ with a forbidden gap $\delta f$ between them:

$$f_{0,2}^{\pm} = \left[1 \pm \frac{\sqrt{2}}{2}\frac{\xi}{d}(1+\cos\theta)^{1/2}\right]f_{0,2}, \quad (6a)$$

$$\delta f = \frac{\sqrt{2}\xi}{d}\left\{1+\cos\left(\frac{2\pi\Delta x}{a}\right)\right\}^{1/2} f_{0,2}. \quad (6b)$$

where $f_{0,2}$ is the cutoff frequency of the second mode ($k_{y,0,2}$) of the $0^{th}$ harmonic in a flat waveguide. Here, $f_{0,2}^+$ is upward shifted with respect to $f_{0,2}$, while $f_{0,2}^-$ is downward shifted and corresponds to the cutoff frequency of the first harmonic ($k_{y,1,1}$). This is relabeled as $f_{0,2}^- {=} f_{1,1}^+$ for emphasis. The amplitude distributions for both waves are shown in FIG. 6A.

Figure 7:
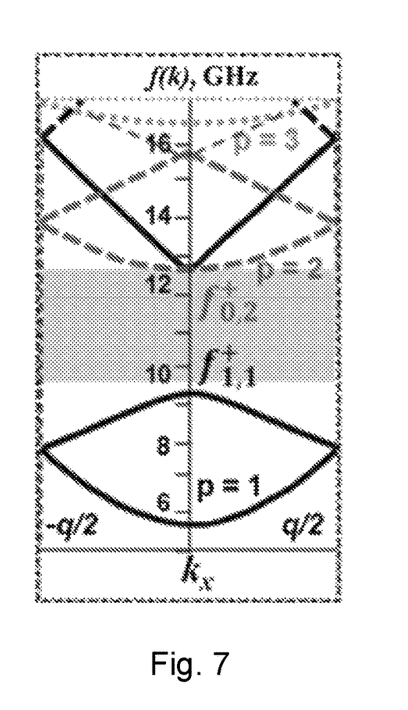
FIG. 7 is a transformation of FIG. 6C dispersion due to the Bloch geometric resonance at $d=a\sqrt{3}/2=2.72$ cm and Δx=0. The degenerate cutoff frequency 11 GHz in FIG. 6C splits into two: $f_{0,2}^+$=12.6 GHz and $f_{1,1}^+$=9.3 GHz, opening a 3.35 GHz Bloch gap (shaded) at $k_x$=0.

The GBR results in a unique waveguide spectrum; the first mode (p=1) has two cutoff frequencies: lower $f_{0,1}$ and upper $f_{1,1}^+$. The dispersion in FIG. 6C does not include the Bloch resonance just for clarity of the above explanation. The transformation of the dispersion in FIG. 6C caused by the GBR is shown in FIG. 7. Propagation of the first (p=1) mode is possible only between the two cutoff frequencies $f_{0,1}$ and $f_{1,1}^+$, and there is a Bloch gap $\delta f$ between the first and second frequencies $f_{1,1}^+$ and $f_{0,2}^+$ as shown by the shaded area in FIG. 7.

GBR was investigated for the experimental setup (FIG. 5A). In this system, a=3.15 cm and from Equation (5b) the resonance occurs when d=2.72 cm. For this d, the cutoff frequency of the second mode is $f_{0,2}$=11.02 GHz and Equation (6a) gives the shifted cutoff frequencies $f_{0,2}^+$=2.69 GHz and $f_{1,1}^+$=9.34 GHz. As seen from Equation (6b), the band gap depends on the phase shift between the plates. At $\Delta x=0$, the band gap has a maximum value $\delta f=2(\xi/d)f_{0,2}$=3.35 GHz, and at $\Delta x=a/2$, it closes, i.e., $\delta f=0$. In FIG. 7 the Bloch gap for $\Delta x=0$ (the shaded area between $f_{0,2}^+$ and $f_{1,1}^+$) is centered at 11.02 GHz.

Equations (4a) and (4b) show that the Bloch gap can be engineered at any $k_x$ over the entire first Brillouin zone, i.e., from $k_x=0$ to $k_x=\pm q/2$, by varying the height d of the waveguide or the period a. The wave vector $k_{x,gap}$ at which the Bloch gap occurs in a hollow waveguide is given by:

$$k_{x,gap} = \left(\frac{\pi}{a}\right)\left[1-(p^2-m^2)\left(\frac{a}{2d}\right)^2\right]. \quad (7)$$

Figure 5B:
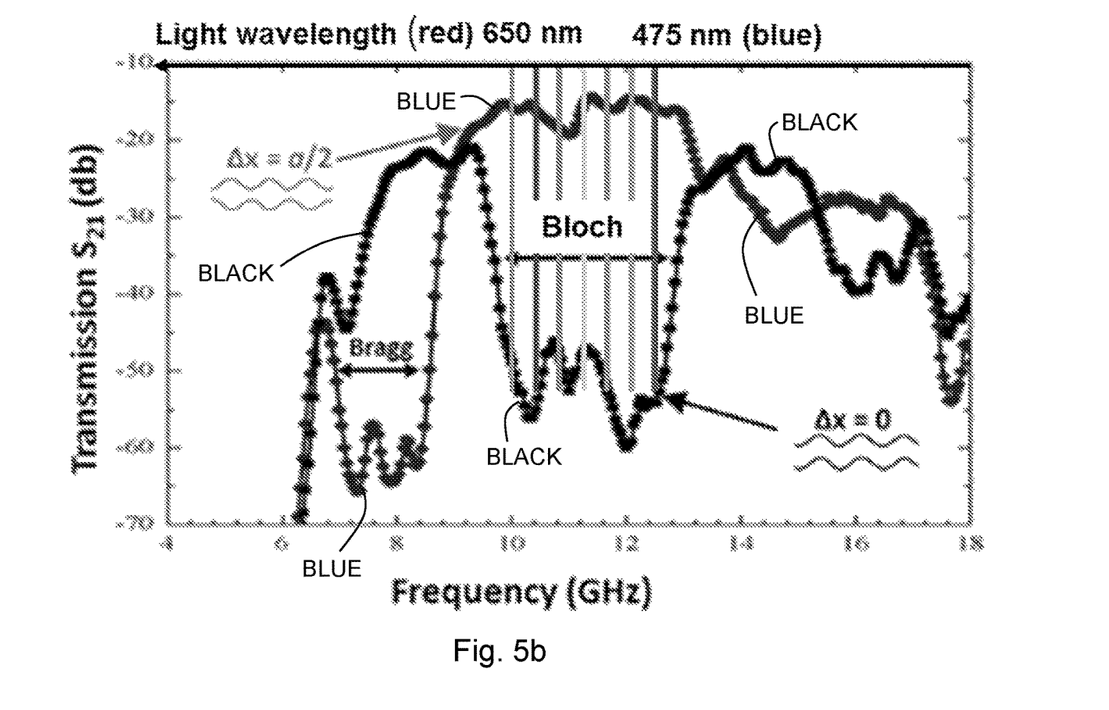
FIG. 5B is a frequency response measurement plot of the test set-up of FIG. 5A for the Bragg mirror resonator configuration (Δx=a/2) having periodic boundary profiles that are out of alignment having a relative phase shift of 180 degrees or a/2, and the Bloch mirror resonator configuration (Δx=0) having periodic boundary profiles that are aligned (in phase). Measured $S_{21}$ versus frequency for two cases: (a) Δx=0 (black line), where a 3.2 GHz Bloch gap opens at 11.2 GHz and $k_x$=0; and (b) Δx=a/2 (blue line), where a 2 GHz Bragg gap opens at 7.6 GHz and $k_x$=q/2 but the Bloch gap closes. The insets show the geometry of the waveguide for the two cases. The upper x-axis in FIG. 5B shows the range of wavelength that would be confined in a Bloch mirror resonator if the waveguide was scaled down to the order of wavelengths of light. The Bloch mirror would easily confine all rainbow components ranging from 650 nm (red) and 475 nm (blue) or even beyond this range.

The disclosure was validated using the experiment of FIG. 5A with two X-band horn antennas and a Hewlett Packard (HP-8510) vector network analyzer (VNA). The waveguide had a width W=6 cm (along the z-axis, into the page) and length L=82 cm. The profiles of the metallic plates had an amplitude $\xi$=0.415 cm and period a=3.15 cm. The transmission parameter $S_{21}$ of the waveguide with a $TE_{01}$ mode input was measured in the microwave frequency range 3-17 GHz. FIG. 5B shows the transmission spectrum for two different positions of the upper plate: $\Delta x=a/2$ (lighter line (labeled blue)) and $\Delta x=0$ (darker line (labeled black)) with the plates separated by d=2.72 cm.

The GBR occurs at $\Delta x=0$ and causes the opening of a 3.2 GHz Bloch gap (between 9.6 and 12.8 GHz) centered at 11.2 GHz. The dispersion $\omega(k)$ for $\Delta x=0$ is shown in FIG. 7. The theoretical value of the Bloch gap is 3.35 GHz as shown by the shaded band below $f_{0,2}^+$. Note that the experimental and theoretical results are in good agreement. When the upper plate is shifted by $\Delta x=a/2$, the Bloch gap at 11.2 GHz closes and a 2.0 GHz Bragg gap opens at $f_B$=7.6 GHz ("blue" line in FIG. 5B). The Bloch gap is 1.6 times as wide as the Bragg gap and the experimental values are close to the theoretical values of 2.1 GHz and $f_B$=7.3 GHz. The dispersion curve for $\Delta x=a/2$ is shown in FIG. 6B, which has a 2.1 GHz Bragg gap located at 7.3 GHz, in good agreement with measured data.

Analogizing the experimental results (using microwaves) to light, if the experimental microwave structure is scaled down to the order of wavelengths of light, then the Bloch mirror would easily confine multiple light components ranging from 650 nm (red) and 475 nm (blue) or even beyond this range.

Bragg gaps in uniform microfibers with periodic boundary profiles have already found commercial use as strain and temperature sensors. The Bloch phenomena also apply to a periodic medium with a flat boundary, in which case the periodic variation of $k_y$ is due to the periodicity of the refractive index of the medium.

Bloch resonances and gaps can be tuned by reconfiguring the boundaries and transformative nanoscale implementations could be achieved using acousto-optic, electro-optic, or piezoelectric transducers. For example, an integrated optic equivalent of the microwave setup shown in FIG. 5A could comprise a $LiNbO_3$ optical waveguide with two surface acoustic waves that are excited on opposite sides of the waveguide and play the same role as the movable boundary plate.

Another potential application for a Bloch gap structure is a distributed feedback (DFB) laser. Replacing the periodic structure in a conventional DFB laser with a Bloch gap material with a wide band gap at $k_x=0$ could open up opportunities for a white-light-DFB laser.

Another potential application is in the field of electronics. In this case, Schrödinger's equation describes the wave phenomena and the "operating wavelength" is the de Broglie wavelength of an electron in a quantum well. A suitable material for fabricating a periodic quantum well that can support a high mobility two-dimensional electron gas is an AlGaAs/GaAs heterostructure. For a typical electron concentration $n_s \sim 10^{11}$ cm$^{-2}$, the de Broglie wavelength of an electron at the Fermi level $\lambda_F$ is in the range of 80-100 nm depending on the electron concentration $n_s$: $\lambda_F = \sqrt{2\pi/n_s}$. If the X-band microwave structure (FIG. 5A) is scaled down in accordance with $\lambda_F$, the lateral periodicity of the quantum waveguide should be ≤80 nm, which is an acceptable scale for nanofabrication.

Although the present disclosure has been described with respect to one or more particular embodiments, it will be understood that other embodiments of the present disclosure may be made without departing from the spirit and scope of the present disclosure.

What is claimed is:

1. A resonator, comprising:
    a waveguide having a first boundary, a second boundary parallel to the first boundary, a first end, a second end, and a waveguide cavity at least partly between the first boundary and the second boundary;
    a first grating at the first boundary of the waveguide, the first grating having a period of distance a;
    a second grating at the second boundary of the waveguide, the second grating having a period of distance a;
    wherein a distance d between the first boundary and the second boundary is equal to $$\frac{a}{2}\sqrt{p^2 - m^2},$$

wherein p and m are mode indices in the waveguide and p>m.

2. The resonator of claim 1, wherein a periodic profile of the first boundary is aligned with a periodic profile of the second boundary along the waveguide.

3. The resonator of claim 1, wherein the waveguide mode indices are p=2 and m=1, and the distance d between the first boundary and the second boundary is equal to $a\sqrt{3}/2$.

4. The resonator of claim 1, wherein a first phase of the first grating is substantially aligned with a second phase of the second grating.

5. The resonator of claim 1, wherein the waveguide cavity is an optical waveguide.

6. The resonator of claim 5, wherein the optical waveguide comprises a dielectric material having a high refractive index.

7. The resonator of claim 6, wherein the dielectric material is GaN.

8. The resonator of claim 1, wherein the first grating and second grating have a sinusoidal profile.

9. The resonator of claim 1, wherein the first grating and second grating have a profile with a thickness between 10% and 30% (inclusive) of the distance d.

10. The resonator of claim 1, wherein the first grating and the second grating are formed using one or more transducers.

11. The resonator of claim 10, wherein one or more transducers are acousto-optic transducers.

12. The resonator of claim 10, wherein one or more transducers are electro-optic transducers.

13. The resonator of claim 10, wherein one or more transducers are piezoelectric transducers.

14. The resonator of claim 10, wherein the first grating and the second grating are acoustic waves.

15. The resonator of claim 1, further comprising an active layer for light generation.

16. A distributed feedback laser, comprising a resonator according to claim 1.

* * * * *